(12) United States Patent
Kruse et al.

(10) Patent No.: US 8,274,297 B2
(45) Date of Patent: Sep. 25, 2012

(54) METHOD AND KIT FOR TESTING 3-PHASE SUPPLIES ONBOARD OF AN AIRCRAFT

(75) Inventors: Guenther Kruse, Hamburg (DE); Thomas Uhlendorf, Bunsoh (DE)

(73) Assignee: Airbus Operations GmbH, Hamburg (DE)

( * ) Notice: Subject to any disclaimer, the term of this patent is extended or adjusted under 35 U.S.C. 154(b) by 280 days.

(21) Appl. No.: 12/744,460

(22) PCT Filed: Nov. 29, 2007

(86) PCT No.: PCT/EP2007/010376
§ 371 (c)(1),
(2), (4) Date: Jul. 15, 2010

(87) PCT Pub. No.: WO2009/068062
PCT Pub. Date: Jun. 4, 2009

(65) Prior Publication Data
US 2010/0277180 A1 Nov. 4, 2010

(51) Int. Cl.
*G01R 31/02* (2006.01)
*G01R 31/14* (2006.01)
(52) U.S. Cl. ........................ 324/537; 702/117
(58) Field of Classification Search .................. 324/537, 324/500, 764.01, 512, 555, 521, 522, 523, 324/527, 763.01; 702/118, 108, 117, 121; 73/583, 579, 570, 865.9
See application file for complete search history.

(56) References Cited

U.S. PATENT DOCUMENTS 5,397,983 A * 3/1995 Zabar et al. .................. 324/133
5,617,039 A 4/1997 Kuck et al.
5,910,775 A * 6/1999 Mears et al. ............... 340/815.4
(Continued)

FOREIGN PATENT DOCUMENTS

CN 101082649 12/2007
(Continued)

OTHER PUBLICATIONS

Chinese Intellectual Property Office, English translation of Chinese Office Action dated Nov. 9, 2010. This translation describes a Chinese language article entitled "Power Supply Parameter Test of Aircraft Power Source System and Analytic Research."

(Continued)

*Primary Examiner* — Hoai-An D Nguyen
(74) *Attorney, Agent, or Firm* — Wood, Herron & Evans

(57) ABSTRACT

The present invention relates to a method for testing power lines and signal lines onboard of an aircraft, wherein the power lines and signal lines normally connect a 3-phase AC motor with the power supply system of the aircraft, and wherein the 3-phase AC motor has separate input terminals onto which, during operation of the 3-phase AC motor onboard of the aircraft, predetermined voltages of predetermined phase difference are to be applied. The method according to the invention comprises the steps of connecting the power lines and signal lines with input terminals (24) of a testing equipment (1), in place of the 3-phase AC motor; applying voltages on the power lines and signal lines; conducting a voltage test, and simultaneously with the voltage test, a phase test by the testing equipment (1) in respect of whether the voltages and the phase difference of the voltages applied to the power lines and signal lines is equal to the predetermined voltages and the predetermined phase difference. The invention further relates to a kit comprising a testing equipment (1) and a plurality of adapters (5).

7 Claims, 2 Drawing Sheets

U.S. PATENT DOCUMENTS

| | | | |
|---|---|---|---|
| 7,301,323 B2 * | 11/2007 | Ichikawa et al. | 324/71.6 |
| 7,400,150 B2 * | 7/2008 | Cannon | 324/522 |
| 7,458,266 B2 * | 12/2008 | Beard et al. | 73/579 |
| 7,478,003 B2 * | 1/2009 | Cowan et al. | 702/117 |
| 2005/0256662 A1 | 11/2005 | Alder | |

FOREIGN PATENT DOCUMENTS

| | | |
|---|---|---|
| EP | 1630566 | 3/2006 |
| RU | 2263382 | 10/2005 |
| RU | 65655 | 8/2007 |
| SU | 1112468 | 9/1984 |
| SU | 1494095 | 7/1989 |

OTHER PUBLICATIONS

English Translation of Decision on Granting a Patent for Invention, Russia Patent Office (4pgs.), Nov. 8, 2011.

Chauvin Arnoux Group: "C.A. 8342, C.A 8340" [Online] May 2006, http://www.chauvin-arnoux.fr/display.asp?7422 with an English-language translation of the product Nos. C.A 8342 and C.A 8340.

Chauvin Arnoux Group: "Controleur d'installation electrique C.A 6115N" [Online] Dec. 2004, http://www.chauvin-arnoux.fr/display.asp?6584. English Title "Electrical Installation".

Chauvin Arnoux Group: "Analyseur de qualite de reseau electronique C.A 8352" [Online] Jan. 2004, http://www.chauvin-arnoux.fr/display.asp?5869. English Title "Power Quality Monitor".

Chauvin Arnoux Group: "Controleurs d'appareillages C.A 6150 C.A 6160" [Online] Jul. 2006, http://www.chauvin-arnoux.fr/display.asp?8226. English Title "Equipment Testers".

International Search Report, PCT/ISA/220, PCT/ISA/210, PCT/ISA/237 with mailing date of Sep. 4, 2008.

* cited by examiner

METHOD AND KIT FOR TESTING 3-PHASE SUPPLIES ONBOARD OF AN AIRCRAFT

This application claims priority to International Application No. PCT/EP2007/010376, filed on Nov. 29, 2007.

The present invention relates to a method and a kit for testing power lines and signal lines onboard of an aircraft. The power lines and signal lines are typically used for connecting a 3-phase AC motor with the power supply system of the aircraft.

BACKGROUND ART

Modern aircrafts accommodate onboard a plurality of 3-phase AC motors which are used to power various facilities onboard of the aircraft, such as fans or ventilators of the air conditioning system which are located in different sections of the cabin, cock-pit, sanitary rooms, cargo compartment or in other areas of the aircraft. A ventilator is normally powered by a 3-phase AC motor. A thermal circuit breaker is accommodated inside the 3-phase AC motor which ensures that the 3-phase AC motor is automatically switched off upon, for example, overheating of the motor windings.

It is important that these 3-phase motors operate correctly, turn in the correct direction and that its safety devices and protections operate correctly as designed. Therefore, during final assembly and after repair or modification of the aircraft, tests are to be performed to verify correct connection and operation of the 3-phase equipment.

One of these tests includes testing the electronic control circuitry onboard of the aircraft in terms of proper functioning of all motors. In the course of these tests, the components and the control logic upstream of the 3-phase AC motors is checked. To this end, the 3-phase AC motors are disconnected prior to performing the tests.

The objective of these tests is to ensure that all terminals (to which the 3-phase AC motor is connected for powering e.g. the ventilators) are present and the correct voltage is applied to the terminals. Secondly, the phase difference of the voltages between the three terminals is verified. In other words, it is to be checked whether the phase on each terminal is as specified, e.g. the phase difference being equal 120°. In addition, it must be inspected whether upon initiation of the thermal circuit breaker, a corresponding warning signal is sent to an indicator which, for example, is located inside the cockpit of the aircraft, and thus visible to the pilot. The warning signal then alerts the pilot that one of the 3-phase AC motors is overheated and therefore automatically switched off.

Up to date, the staff conducting the maintenance or production tests and inspections had to manually check each terminal in terms of correct voltage and correct phase difference. An initiation of the thermal circuit breaker had to be manually simulated in order to test whether initiation of the thermal circuit breaker effected output of a corresponding warning signal (e.g. "motor overheated" or "motor failure") to the cockpit of the aircraft. Thus, these tests and inspections required much manpower and many different test tools and were cost-intensive.

It is therefore an object of the invention to provide a method and a kit for testing power lines and signal lines onboard of an aircraft which considerably facilitate the ground tests of an aircraft. In particular, the present invention provides a method and a kit for testing power lines and signal lines to and from 3-phase AC motors installed onboard of the aircraft in terms of correct voltage and correct phase difference.

SUMMARY

This and other objects are solved by a method for testing power lines and signal lines onboard of an aircraft, wherein the power lines and signal lines normally connect a 3-phase AC motor with the power supply system of the aircraft, and wherein the 3-phase AC motor has separate input terminals onto which, during operation of the 3-phase AC motor onboard of the aircraft, predetermined voltages of predetermined phase difference are to be applied. The method according to the invention comprises the steps of connecting the power lines and the signal lines with input terminals of a testing equipment, in place of the 3-phase AC motor; applying voltages on the power lines and signal lines; conducting a voltage test by the testing equipment in respect of whether the voltages applied to the power lines and signal lines are equal to the predetermined voltages; and conducting a phase test by the testing equipment simultaneously with the voltage test in respect of whether a phase difference of the voltages applied to the power lines and signal lines is equal to the predetermined phase difference.

With the method according to the invention, the ground tests of an aircraft, and particularly tests relating to the correct voltage and correct phase difference applied to input terminals of a 3-phase AC motor, can be conducted in a time-efficiently manner. Thus, it is no longer required to check the voltages, and the phase difference thereof, applied to input terminals of a 3-phase AC motor manually by the maintenance or production staff. The components and the control logic upstream of the 3-phase AC motors are inspected. The testing equipment to be used for the method according to the invention is capable of simultaneously conducting a voltage and a phase test, thus considerably less time is consumed for completing the ground tests of the aircraft.

Preferably, the method according to the invention comprises connecting output terminals of the testing equipment with the input terminals of the 3-phase AC motor, whereby the voltages and the phase difference thereof applied to the input terminals of the 3-phase AC motor are monitored by the testing equipment.

According to a preferred embodiment of the invention, the step of connecting output terminals of the testing equipment with the input terminals of the 3-phase AC motor is performed automatically. Thus, the components and the control logic upstream of the 3-phase AC motors are inspected first, and if they are working correctly, the 3-phase motor is automatically connected, switched on and operated.

In a preferred embodiment, the method comprises the step of simulating by the testing equipment an initiation of a thermal circuit breaker accommodated in the 3-phase AC motor for protecting the 3-phase AC motor from overheating, thereby ascertaining that a corresponding warning signal is sent along the signal lines to an indicator indicating failure of the 3-phase AC motors. In addition to the voltage test and the phase test, the testing equipment used in the method according to the invention is capable of simulating initiation of a thermal circuit breaker. These thermal circuit breakers are important in terms of preventing overheating of the 3-phase AC motors during operation of the aircraft, and thereby minimizing the risk of causing fire onboard of the aircraft. Using the method according to the invention, the proper functioning of the monitoring circuitry for the thermal circuit breakers can be easily checked at the same time the other ground tests are performed on the 3-phase input terminals of the 3-phase AC motors.

Another preferred embodiment of the method according to the invention makes use of different adapters for connecting differently configured terminals of the signal lines with the input terminals of the testing equipment. Terminals of power lines and signals lines which are to be connected to different 3-phase AC motors in different sections onboard of an aircraft are differently configured. Hence, for testing the wiring scheme upstream of each of these different 3-phase AC motors and the correct voltage and correct phase difference applied to the input terminals of these 3-phase AC motors, different testing equipments with differently configured terminals may have to be used. This is obviated by the use of different adapters used together with only one testing equipment. This considerably facilitates these tests and saves time for performing the tests.

The method according to the invention may be used for inspecting the control logic or the electronic infrastructure onboard of an aircraft upstream of different 3-phase AC motors, such as 3-phase AC motors used in the air-conditioning system, air-recirculation motors and fuel pump motors, or any other 3-phase consumers.

In another aspect, the invention features a kit comprising a testing equipment and a plurality of adaptors for connecting differently configured terminals of signals lines onboard of an aircraft with input terminals of the testing equipment. The testing equipment included in the kit according to the invention comprises means for determining whether the voltages applied to the input terminals of the testing equipment correspond to predetermined voltages, and means for determining whether a phase difference of the voltages applied to the input terminals of the testing equipment is equal to a predetermined phase difference.

Preferably, the testing equipment included in the kit according to the invention is configured for determining that the predetermined voltages equal 115 V, and in addition, the testing equipment is configured for determining that the predetermined phase difference is 120°. Thus, the maintenance or production staff only needs one kit according to the invention in order to perform all maintenance tests on different 3-phase AC motors installed onboard of an aircraft. Thus, the ground tests are considerably facilitated, the time for performing the maintenance tests is substantially shortened, and the amount of test equipment required is reduced.

Other features and advantages of the invention will become apparent from the following detailed description of a preferred embodiment of the invention, thereby referring to the appended drawings.

Figure 1:
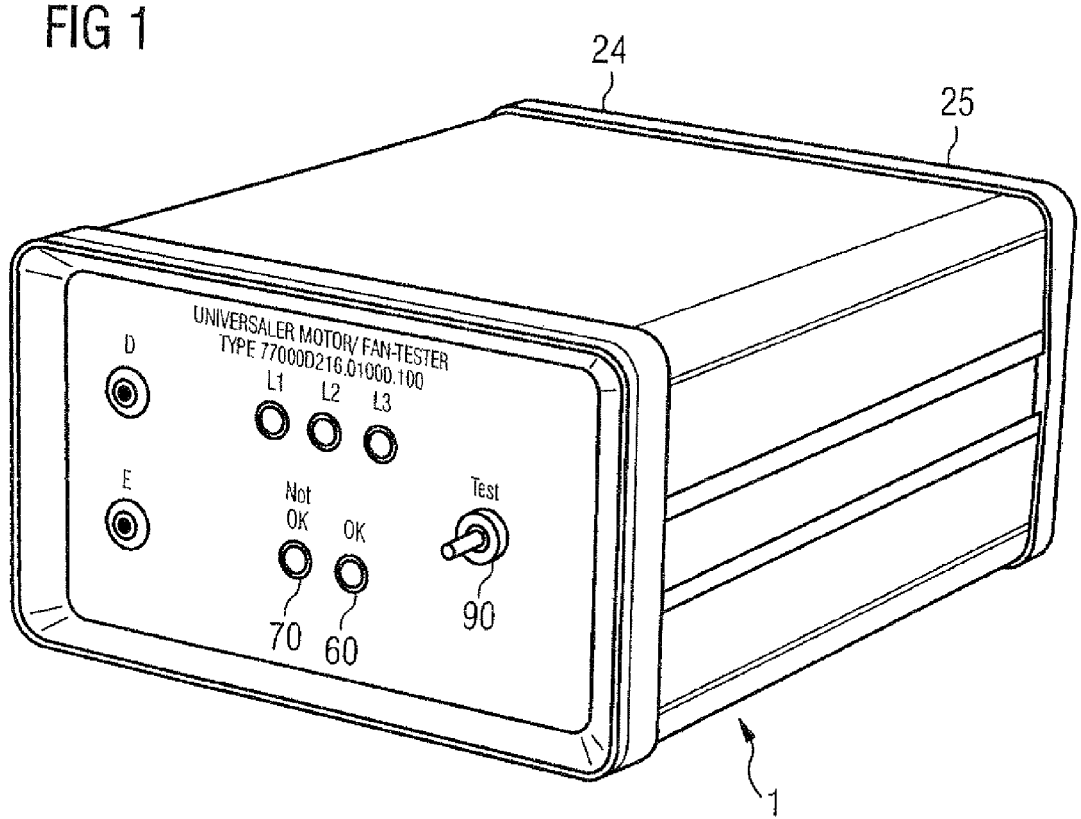
FIG. 1 is a perspective view of a testing equipment to be used for the method according to the present invention.

The testing equipment 1 to be used in the method according to the invention is shown in FIG. 1. The testing equipment 1 is particularly suitable for verifying that the correct voltages and the correct phase difference are applied to the input terminals of a 3-phase AC motor installed onboard of an aircraft. Furthermore, the testing equipment 1 is capable of simulating initiation of a thermal circuit breaker typically accommodated in a 3-phase AC motor for preventing overheating of the motor windings, thereby minimizing the risk of causing fire onboard of the aircraft, The testing equipment 1 is shown in a perspective view in FIG. 1. The front panel of the testing equipment 1 includes three LEDs L1, L2, L3. The three LEDs L1, L2, L3 are active if the correct voltage is applied to the input terminals 24 (see FIG. 2) on the rear side of the testing equipment 1. The voltage applied to the input terminals 24 of the testing equipment 1 is correct, if the same voltage were to be applied to the input terminals of a 3-phase AC motor installed onboard of an aircraft, and the 3-phase AC motor would not exhibit any failure or malfunctioning, that is to say, if the voltage would be equal to 115 V. Furthermore, if the phase difference equals a pre-determined phase difference, such as 120°, an LED 60 labeled "OK" will be active indicating that the phase difference of the applied voltages is correct. An LED 70 labeled "NOT OK" will be active if the phase difference is not equal to a predetermined phase difference, but correct voltages are applied to the input terminals of the testing equipment 1.

In addition, a test switch 90 is provided on the front panel of the testing equipment 1 which is used in the method according to the invention for simulating initiation of a thermal circuit breaker accommodated in a 3-phase AC motor. Terminals "D" and "E" are used for troubleshooting in case that power is not automatically switched through to the motor due to an aircraft failure.

Output terminals 25 are provided on the rear side of the testing equipment 1 (see FIG. 2) which can be connected with input terminals of a 3-phase AC motor. The output terminals 25, however, can be left open, if desired.

Figure 2:
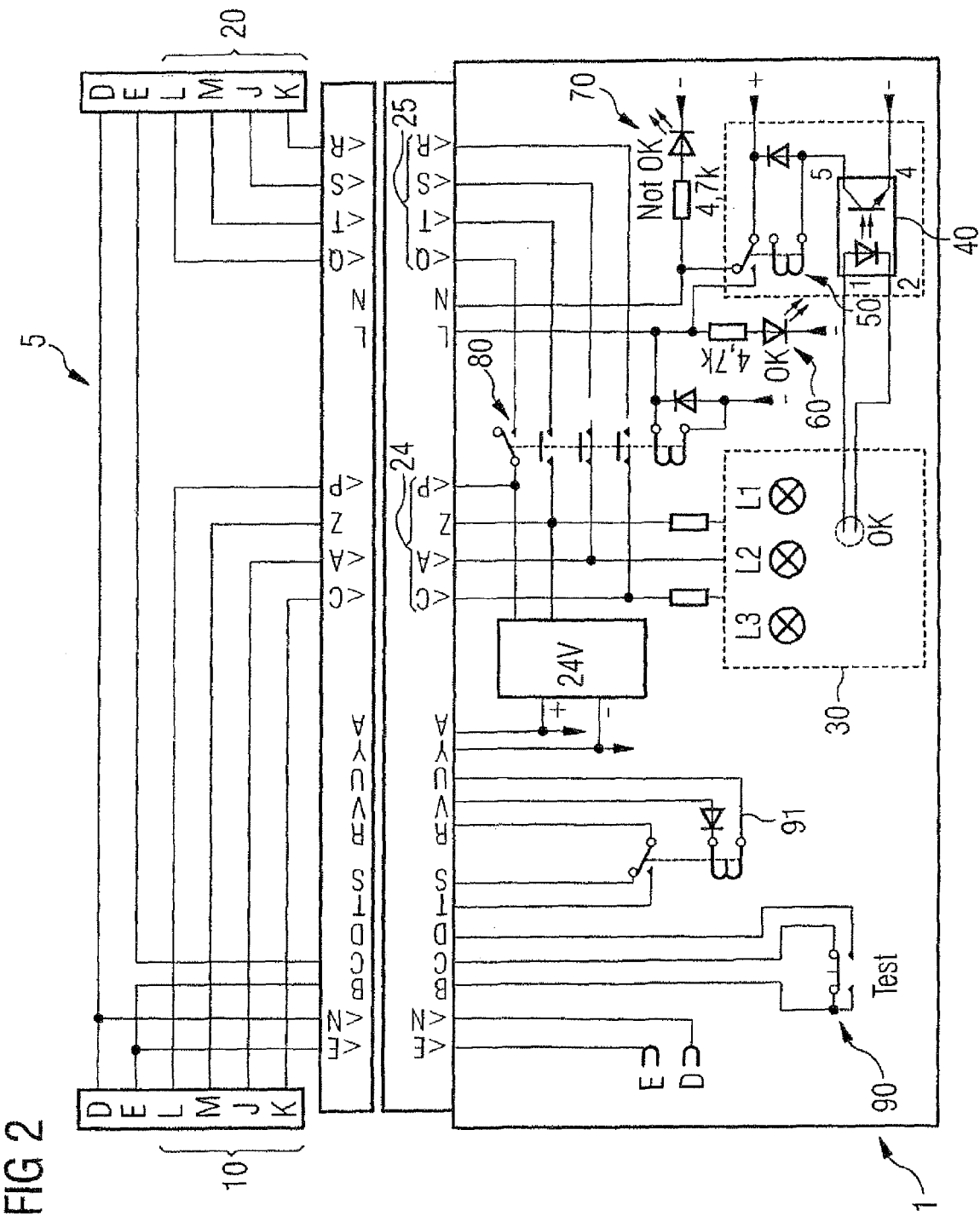
FIG. 2 is a wiring diagram of the testing equipment shown in FIG. 1.

FIG. 2 shows a wiring diagram of the testing equipment 1 shown in FIG. 1. Input terminals 24 are connected via conducting paths to a phase sequence tester 30. The result of the phase sequence test performed by the phase sequence tester 30 is indicated by LEDs L1, L2 and L3. If a predetermined or correct voltage, e.g. 115 V, is applied to all three input terminals 24 of the testing equipment 1, then all three LEDs L1, L2, L3 are active.

Due to the phase difference between the voltages on the different conducting paths between the input terminals 24 and the phase sequence tester 30, a time-varying magnetic field is created. The time-varying magnetic field results in a time-dependent electromagnetic force which causes closure of switches 80. Upon closure of the switches 80, the conducting paths carry the respective voltages to the output terminals 25, and from there to a connected 3-phase AC motor.

If the phase sequence tester 30 detects that the phase differences of the voltages applied to the input terminals 24 of the testing equipment equals a predetermined phase difference, e.g. 120°, a voltage is applied to the opto-electronic coupler 40 which then causes a current flow through the coil of relay 50, as a result of which the switch of the relay 50 is closed. Accordingly, a current flows through LED 60 which will then be active indicating that correct voltages and the correct phase difference is applied to the input terminals 24. If the opto-electronic coupler 40 is not actuated due to either the phase sequence tester having detected an incorrect voltage on one of the conducting paths between the input terminals 24 and the phase sequence tester or due an incorrect phase difference between these voltages, relay 50 remains open and thus LED 70 will be active indicating failure of the test performed by the phase sequence tester 30.

In addition, the testing equipment 1 includes a test switch 90, which, upon pressing of the test switch 90, initiates simulation of a thermal circuit breaker inside a 3-phase AC motor. If the test switch 90 is not pressed, signal lines D and E are continuously connected. For motors switching at different voltages, a relay 91 is connected to switch 90 via the adapter 5 wiring.

The overheat circuit in the motor can be passed by for troubleshooting by electrically connecting terminal "D" and terminal "E" using an ordinary cable (see FIG. 1 for terminal "D" and terminal "E").

Versatility of the testing equipment 1 is enhanced by providing a plurality of adapters 5 which are configured in accordance with differently configured input terminals of different 3-phase AC motors onboard of an aircraft. An adapter 5 includes input terminals 10 and output terminals 20. The adapter 5 is connected to the input terminals 24 of the testing equipment 1.

The essence of the invention is to provide a method and a kit for testing power lines and signal lines onboard of an aircraft such as to verify whether correct voltages and a correct phase difference between these voltages are applied on the power lines and signal lines leading to input terminals of a 3-phase AC motor. The testing in terms of the correct voltages and the correct phase difference can be done by using a testing equipment 1 which indicates to the user that the applied voltages and the phase difference are correct. The components, signal lines, terminals etc., that is to say the electronic infrastructure or control logic permanently installed onboard of the aircraft upstream of the 3-phase AC motor are tested in order to determine whether, during normal operation of the aircraft, and thus of the 3-phase AC motor, correct voltages and a correct phase difference will be applied to the input terminals of the 3-phase AC motor. Thus, the 3-phase input signals to various 3-phase AC motors of an aircraft can be measured by the testing equipment 1, thereby ensuring correct operation of the 3-phase AC motor during operation of the aircraft. In addition, the testing equipment 1 is also capable of simulating initiation of a thermal circuit breaker accommodated inside the 3-phase AC motor for safety reasons.

Thus, the method and kit according to the invention provides an easy and convenient way for maintenance and production staff of an aircraft to test the power lines and signal lines installed upstream of various 3-phase AC motors provided onboard of the aircraft, without having to test these power lines and signal lines manually in terms of correctly applied voltages and correct phase difference.

The invention claimed is:

1. Method for testing power lines and signal lines onboard of an aircraft, the power lines and signal lines connecting a 3-phase AC consumer with the power supply system of the aircraft, the 3 phase AC consumer having separate input terminals onto which, during operation of the 3-phase AC consumer onboard of the aircraft, predetermined voltages of predetermined phase difference are to be applied, the method comprising the steps of:

connecting the power lines and signal lines with input terminals of a testing equipment, in place of the 3-phase AC consumer;

applying voltages to the power lines;

conducting a voltage test by the testing equipment in respect of whether the voltages applied to the power lines are equal to the predetermined voltages;

conducting a phase test by the testing equipment simultaneously with the voltage test in respect of whether a phase difference of the voltages applied to the power lines is equal to the predetermined phase difference; and automatically connecting output terminals of the testing equipment with the input terminals of the 3-phase AC consumer, if the voltages applied to the power lines are equal to predetermined voltages and the phase difference of the voltages applied to the power lines is equal to a predetermined phase difference, whereby the voltages and the phase difference applied to the input terminals of the 3-phase AC consumer are monitored by the testing equipment.

2. Method according to claim 1, further comprising the step of:

simulating by the testing equipment initiation of a thermal circuit breaker accommodated in the 3-phase AC consumer for protecting the 3-phase AC consumer from overheating, thereby ascertaining that a corresponding warning signal is sent along the signal lines to an indicator indicating failure of the 3-phase AC consumer.

3. Method according to claim 1, wherein different adapters are used for connecting differently configured terminals of the power lines and signal lines with the input terminals of the testing equipment, the differently configured terminals of the power lines and signal lines are connected with differently configured input terminals of different 3-phase AC consumers onboard of the aircraft during operation of the aircraft.

4. Method according to claim 1, wherein the 3-phase AC consumer is selected from the group consisting of a 3-phase AC air-conditioning motor, an air-recirculation motor, a fuel pump motor, or any other 3-phase consumer.

5. Kit comprising a testing equipment and a plurality of adapters for connecting differently configured terminals of power lines and signal lines onboard of an aircraft with input terminals of the testing equipment, the testing equipment comprising:

output terminals means for determining whether voltages applied to the input terminals of the testing equipment correspond to predetermined voltages;

means for determining whether a phase difference of the voltages applied to the input terminals of the testing equipment is equal to a predetermined phase difference; and means for automatically connecting the output terminals of the testing equipment with input terminals of a 3-phase AC consumer, if the voltages applied to the power lines are equal to predetermined voltages and the phase difference of the voltages applied to the power lines is equal to a predetermined phase difference, whereby the voltages and the phase difference applied to the input terminals of the 3-phase AC consumer are monitored by the testing equipment.

6. Kit according to claim 5 wherein the testing equipment is configured for determining that the predetermined voltages equal 115 V.

7. Kit according to claim 5, wherein the testing equipment is configured for determining that the predetermined phase difference is 120°.

* * * * *